(12) United States Patent
Yang et al.

(10) Patent No.: US 8,902,489 B2
(45) Date of Patent: Dec. 2, 2014

(54) ELECTROWETTING DISPLAY AND METHOD OF MANUFACTURING THE SAME

(71) Applicant: Liquavista B.V., Eindhoven (NL)

(72) Inventors: SungHoon Yang, Seoul (KR); Woo Yong Sung, Seoul (KR)

(73) Assignee: Liquavista B.V., Eindhoven (NL)

( * ) Notice: Subject to any disclaimer, the term of this patent is extended or adjusted under 35 U.S.C. 154(b) by 0 days.

(21) Appl. No.: 13/759,340

(22) Filed: Feb. 5, 2013

(65) Prior Publication Data

US 2013/0329274 A1 Dec. 12, 2013

(30) Foreign Application Priority Data

Jun. 8, 2012 (KR) .................. 10-2012-0061721

(51) Int. Cl.
G02B 26/00 (2006.01)
(52) U.S. Cl.
CPC .................... G02B 26/005 (2013.01)
USPC .......................................................... 359/290
(58) Field of Classification Search
CPC ............... G02B 26/004; G09G 3/3433; G09G 2300/0426
USPC ................. 359/245, 228, 253, 315, 318, 665, 359/290–292; 345/41, 48, 60, 84, 204; 349/1, 12
See application file for complete search history.

(56) References Cited

U.S. PATENT DOCUMENTS

| | | | |
|---|---|---|---|
| 7,548,363 B2 | 6/2009 | Hayes et al. | |
| 7,760,420 B2 | 7/2010 | Cheng et al. | |
| 7,763,314 B2 | 7/2010 | Dai et al. | |
| 7,839,558 B2 | 11/2010 | Cheng et al. | |
| 7,847,996 B2 | 12/2010 | Chen et al. | |
| 8,040,583 B2 | 10/2011 | Takahashi | |
| 8,106,861 B2 | 1/2012 | Lee et al. | |
| 8,428,416 B2 * | 4/2013 | Fan et al. ...................... | 385/129 |
| 2009/0058840 A1 | 3/2009 | Lee et al. | |
| 2009/0085909 A1 | 4/2009 | Chen et al. | |
| 2009/0195850 A1 | 8/2009 | Takahashi | |
| 2011/0084944 A1 | 4/2011 | Bae | |
| 2011/0303541 A1 | 12/2011 | Garimella et al. | |

FOREIGN PATENT DOCUMENTS

| | | |
|---|---|---|
| JP | 2009-031795 | 2/2009 |
| KR | 10-2007-0099706 A | 10/2007 |
| KR | 10-2008-0004987 A | 1/2008 |
| KR | 10-2011-0074087 A | 6/2011 |
| KR | 10-2012-0021075 A | 3/2012 |

* cited by examiner

*Primary Examiner* — Tuyen Tra
(74) *Attorney, Agent, or Firm* — Lee & Hayes, PLLC (57) ABSTRACT

An electrowetting display includes first and second substrates facing each other, an electrowetting layer, a first electrode, a second electrode, and a hydrophobic barrier layer. The electrowetting layer is disposed between the first substrate and the second substrate and includes a first fluid and a second fluid, and the first fluid has an electrical conductivity or a polarity. The first electrode is disposed on the first substrate, and the second electrode forms an electric field in cooperation with the first electrode to control a position of the first fluid. The hydrophobic barrier layer is disposed between the first substrate and the electrowetting layer to cover the first electrode and includes a first surface making contact with the first electrode and a second surface having a hydrophobicity stronger than a hydrophobicity of the first surface and making contact with the electrowetting layer.

17 Claims, 12 Drawing Sheets

ELECTROWETTING DISPLAY AND METHOD OF MANUFACTURING THE SAME

CROSS-REFERENCE TO RELATED APPLICATION

This U.S. non-provisional patent application claims priority under 35 U.S.C. §119 of Korean Patent Application No. 10-2012-0061721, filed on Jun. 8, 2012, the contents of which are hereby incorporated by reference.

TECHNICAL FIELD

Embodiments of the present disclosure relate to an electrowetting display that can display an image using an electrowetting effect and a method of manufacturing the electrowetting display.

DISCUSSION OF THE RELATED ART

Flat panel displays, such as liquid crystal displays (LCDs), plasma display panels (PDPs), organic light emitting displays (OLEDs), field effect displays (FEDs), electrophoretic displays (EPDs), or electrowetting displays (EWDs) are widely used.

The electrowetting display includes two electrodes spaced apart from each other and an electrowetting layer disposed between the two electrodes. The electrowetting layer includes two kinds of fluids, which are not mixed with each other. One of the two fluids has electrical conductivity or a polarity, and at least one of the two fluids has optical properties to absorb, reflect, or filter light. Accordingly, when positions of first and second fluids in the electrowetting layer are controlled by using an electric field formed between the two electrodes, optical properties of light provided to the electrowetting layer are controlled, thereby displaying images.

The liquid crystal display uses liquid crystal, which may be high priced. Accordingly, there is a limit to reducing a manufacturing cost of the liquid crystal display.

SUMMARY

Embodiments of the present disclosure provide an electrowetting display that provides a simplified structure and can be easily manufactured and a method of manufacturing the electrowetting display.

An embodiment of the inventive concept provides an electrowetting display includes a first substrate and a second substrate facing the first substrate, an electrowetting layer, a first electrode, a second electrode, and a hydrophobic barrier layer.

The electrowetting layer is disposed between the first substrate and the second substrate and includes a first fluid and a second fluid, and the first fluid has an electrical conductivity or a polarity. The first electrode is disposed on the first substrate, and the second electrode forms an electric field in cooperation with the first electrode to control a position of the first fluid.

The hydrophobic barrier layer is disposed between the first substrate and the electrowetting layer to cover the first electrode and includes a first surface making contact with the first electrode and a second surface having a hydrophobicity stronger than a hydrophobicity of the first surface and contacting the electrowetting layer.

An embodiment of the inventive concept provides a method of manufacturing an electrowetting display is provided as follows. When a first electrode is formed on a first substrate, a preliminary barrier layer is formed on the first substrate to cover the first electrode. Then, a surface-treatment is performed on an exposed surface of the preliminary barrier layer to form a hydrophobic barrier layer and a second electrode is formed on a second substrate. After that, an electrowetting layer is formed between the first substrate and the second substrate to contact the hydrophobic barrier layer.

An embodiment of the inventive concept provides a method of manufacturing an electrowetting display is provided as follows. When a first electrode is in a pixel area of a first substrate, a plurality of partition walls is formed in a periphery of the pixel area and a preliminary hydrophobic layer is formed on the first substrate to cover the partition walls and the first electrode. Then, the preliminary hydrophobic layer is patterned to form a hydrophobic layer in the pixel area. Thereafter, a second electrode is formed on a second substrate, and an electrowetting layer is formed between the first substrate and the second substrate to contact the hydrophobic layer.

The hydrophobic layer is formed by etching portions of the partition walls and performing a lift-off process on the preliminary hydrophobic layer to remove the preliminary hydrophobic layer on the partition walls.

According to an embodiment, there is provided a method of manufacturing an electrowetting display, the method including forming a hydrophilic layer on an electrode and transforming an upper portion of the hydrophilic layer into a hydrophobic layer, wherein the hydrophobic layer is positioned between the hydrophilic layer and an electrowetting layer.

According to the embodiments, the hydrophobic barrier layer includes the hydrophobic surface and the hydrophilic surface facing the hydrophobic surface, and thus wettability with respect to one of the fluids in the electrowetting layer may be increased using the hydrophobic surface. The electrode may be protected from the electrowetting layer by using a superior adhesive force between the hydrophilic surface and the electrode. Accordingly, although the hydrophobic barrier layer has a single-layer structure, the hydrophobic barrier layer simultaneously performs two functions related to the hydrophobic and hydrophilic surfaces, which have different surface properties, so that two separate layers to perform the two functions may be replaced with the hydrophobic barrier layer.

According to an embodiment, the hydrophobic barrier layer is divided into the hydrophobic portion and the hydrophilic portion in accordance with the materials included in the hydrophobic barrier layer, but the hydrophobic barrier layer has a single-layer structure. Thus, the adhesive force between the hydrophobic portion and the hydrophilic portion of the hydrophobic barrier layer may be prevented from decreasing.

The thin layer having hydrophobicity is formed in the pixel area through the surface-treatment process using the partition walls as a mask. Therefore, the thin layer having hydrophobicity may be easily formed in the pixel area without performing a separate photolithography process.

When the preliminary layer, on which the surface-treatment process is performed, is formed by a chemical vapor deposition process and the reaction gas injected into the chamber is properly controlled, the surface-treatment process and the chemical vapor deposition process may be successively performed in the same chamber. Accordingly, a time required to manufacture the electrowetting display may be reduced.

The thin layer having hydrophobicity may be formed in the pixel area using a lift-off process without performing a separate photolithography process. Thus, a time required to manufacture the electrowetting display may be reduced.

BRIEF DESCRIPTION OF THE DRAWINGS

The embodiments of the present invention will become readily apparent by reference to the following detailed description when considered in conjunction with the accompanying drawings wherein.

DETAILED DESCRIPTION

It will be understood that when an element or layer is referred to as being "on", "connected to" or "coupled to" another element or layer, it can be directly on, connected or coupled to the other element or layer or intervening elements or layers may be present. The present invention may be embodied in various different ways and should not be construed as limited to the exemplary embodiments described herein. As used herein, the term "and/or" includes any and all combinations of one or more of the associated listed items. As used herein, the singular forms, "a", "an" and "the" are intended to include the plural forms as well, unless the context clearly indicates otherwise.

Hereinafter, embodiments of the present invention will be described in detail with reference to the accompanying drawings, wherein the same reference numerals may be used to denote the same or substantially the same elements throughout the specification and the drawings.

Figure 1:
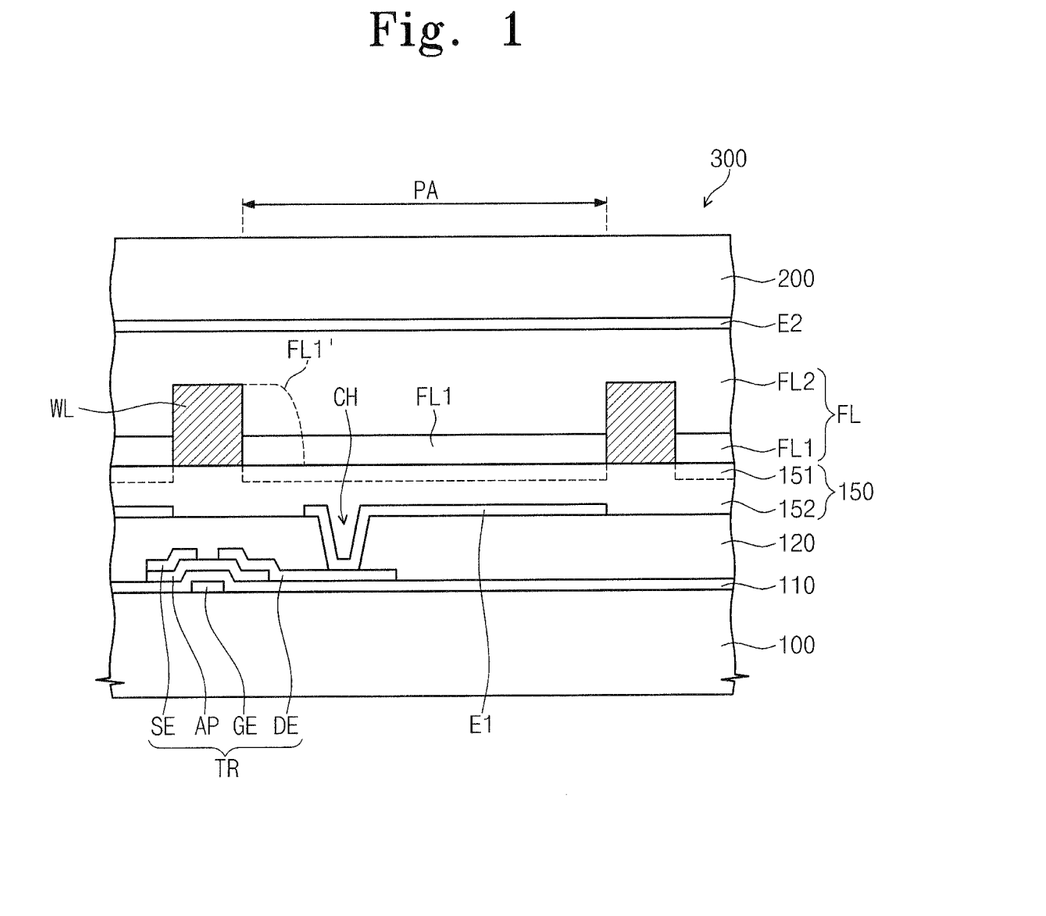
FIG. 1 is a cross-sectional view showing an electrowetting display according to an exemplary embodiment of the present invention.

FIG. 1 is a cross-sectional view showing an electrowetting display 300 according to an exemplary embodiment of the present invention. The electrowetting display 300 includes a plurality of pixels respectively arranged in a plurality of pixel areas. The pixels have the same or substantially the same structure and function. Hereinafter, one pixel will be described in detail with reference to FIG. 1 as a representative example.

Referring to FIG. 1, the electrowetting display 300 includes a first substrate 100, a second substrate 200, a plurality of partition walls WL, a thin film transistor TR, an electrowetting layer FL, a first electrode E1, a second electrode E2, and a hydrophobic barrier layer 150.

According to an embodiment, the first substrate 100 is, but not limited to, an insulating substrate made of, e.g., glass or plastic, and the first substrate 100 includes the pixel areas PA. When the electrowetting display 300 is a transmission-type display device including a light source, the first substrate 100 includes an insulating material having light transmittance, but it should not be limited thereto or thereby. For instance, according to an embodiment, when the electrowetting display 300 is a reflection-type display device that reflects light incident through the second substrate 200 from an outside source of the electrowetting display 300, the first substrate 100 includes a material having high light reflectance, e.g., a metal material.

The second substrate 200 is disposed to face the first substrate 100 and coupled with the first substrate 100, with a space provided between the first and second substrates 100 and 200. According to an embodiment, the second substrate 200 is, but not limited to, a glass substrate or a flexible plastic substrate.

The second electrode E2 is disposed on the second substrate 200 and formed of a transparent conductive material. The second electrode E2 generates an electric field in cooperation with the first electrode E1 to control movement of different kinds of fluids in the electrowetting layer FL. In an exemplary embodiment, the second electrode E2 is disposed on the second substrate 200 to face the first electrode E1, and the electrowetting layer FL is disposed between the first and second electrodes E1 and E2, but it should not be limited thereto or thereby. Alternatively, the second electrode E2 is disposed on the first substrate 100 and is spaced apart from the first electrode E1.

The thin film transistor TR is disposed on the first substrate 100. The thin film transistor TR includes a gate electrode GE, an active pattern AP, a source electrode SE, and a drain electrode DE. The gate electrode GE is electrically connected to a gate line and receives a gate signal from the gate line. The active pattern AP includes a semiconductor material, e.g., amorphous silicon, and is disposed on the gate electrode GE. A gate insulating layer 110 is disposed between the active pattern AP and the gate electrode GE. The source electrode SE is electrically connected to a data line and receives a data signal. The source electrode SE is disposed on the active pattern AP. The drain electrode DE is spaced apart from the source electrode SE and is disposed on the active pattern AP. The drain electrode DE is electrically connected to the first electrode E1 through a contact hole CH formed through an organic insulating layer 120 that covers the thin film transistor TR.

According to the thin film transistor TR as described above, when the gate signal is applied to the gate electrode GE through the gate line, the thin film transistor TR is turned on. When the thin film transistor TR is turned on, the data signal transmitted through the data line is applied to the first electrode E1 through the turned-on thin film transistor TR.

The first electrode E1 is disposed on the organic insulating layer 120 and electrically connected to the drain electrode DE through the contact hole CH formed through the organic insulating layer 120. When the electrowetting display 300 is a transmission-type display device, the first electrode E1 includes a transparent conductive material, such as indium tin oxide (ITO), or indium zinc oxide (IZO). When the electrowetting display 300 is a reflection-type display device, the first electrode E1 includes a metal material having high light reflectance, such as aluminum, nickel, or an alloy thereof.

In an exemplary embodiment, the hydrophobic barrier layer 150 is disposed between the first substrate 100 and the electrowetting layer FL and covers the first electrode E1. The hydrophobic barrier layer 150 prevents chemical reaction from occurring between the first electrode E1 and the electrowetting layer FL.

The hydrophobic barrier layer 150 includes a hydrophobic portion 151 and a hydrophilic portion 152. The hydrophobic portion 151 contacts the electrowetting layer FL. The hydrophobic portion 151 may increase wetting properties, e.g., wettability, between the hydrophobic barrier layer 150 and the electrowetting layer FL.

The hydrophilic portion 152 contacts the first electrode E1. The hydrophilic portion 152 may increase an adhesive force between the hydrophobic barrier layer 150 and the first electrode E1 when the first electrode E1 includes the conductive material, such as, for example, ITO and IZO.

According to an embodiment, the hydrophilic portion 152 includes an inorganic insulating material, and the hydrophobic portion 151 includes a fluorine-containing inorganic insulating material. The hydrophilic portion 152 includes at least one of silicon oxide (SiOx) or silicon nitride (SiNx), and the hydrophobic portion 151 includes at least one of fluorinated silicon oxide (SiOF) or fluorinated silicon nitride (SiNF). A structure and function of the hydrophobic barrier layer 150 will be described in detail with reference to FIG. 2.

The partition walls WL are disposed to correspond to peripheries of the pixel areas PA and accommodate at least one of first and second fluids FL1 and FL2 of the electrowetting layer FL in the pixel areas PA. The partition walls WL may have a hydrophobicity lower than a hydrophobicity of the hydrophobic portion 151. The partition walls WL include an organic insulating material that have a hydrophobicity lower than a hydrophobicity of the hydrophobic portion 151. The organic insulating material includes fluorinated silicon oxide or fluorinated silicon nitride.

The partition walls WL are disposed on the hydrophobic barrier layer 150, and the hydrophilic portion 152 is disposed in an area where the hydrophobic barrier layer 150 overlaps the partition walls WL. The hydrophobic portion 151 and the hydrophilic portion 152 are disposed in portions of the hydrophobic barrier layer 150, which correspond to the pixel areas PA. The hydrophobic portion 151 is disposed corresponding to the pixel areas PA, so the hydrophobic portion 151 does not overlap the partition walls WL when viewed in a plan view. The position of the hydrophobic portion 151 is related to a method of manufacturing the electrowetting display 300, which will be described in detail with reference to FIGS. 5A to 5C.

The electrowetting layer FL includes the first fluid FL1 and the second fluid FL2, which are not mixed with each other, and is disposed between the first substrate 100 and the second substrate 200. According to an embodiment, the first fluid FL1 has electrical non-conductivity or non-polarity and includes alkane, e.g., hexadecane, and oil, e.g., silicon oil.

The first fluid FL1 includes pigments or dyes, or is colored by dyes. For instance, the first fluid FL1 includes colored pigments or dyes, or is colored by colored dyes, so that the first fluid FL1 may filter white light from an external source to a specific color of light. According to an embodiment, the first fluid FL1 includes black pigments or black dyes, or is colored by black dyes, and thus the first fluid FL1 may absorb white light. However, the first fluid FL1 should not be limited to the above-mentioned properties. For example, according to embodiments, a color filter is disposed on the first substrate 100 or the second substrate 200 to filter white light to a specific color of light instead of filtering white light by using the first fluid FL1.

According to an embodiment, the second fluid FL2 has electrical conductivity or polarity and is transparent. For instance, the second fluid FL2 includes a mixture of water and ethyl alcohol, in which potassium chloride is dissolved, or sodium chloride solution. Accordingly, when an attractive force occurs between the second fluid FL2 and the first electrode E1 by an electric field generated between the first electrode E1 and the second electrode E2, the second fluid FL2 moves to the first electrode E1 in the electrowetting layer FL. As a result, as indicated by an imaginary line FL1', the first fluid FL1 may be pushed to an edge portion of the pixel area PA by the second fluid FL2. According to the movement of the first fluid FL1 and the second fluid FL2 in the electrowetting layer FL, the electrowetting layer FL may function as a light shutter to selectively block or filter white light.

Figure 2:
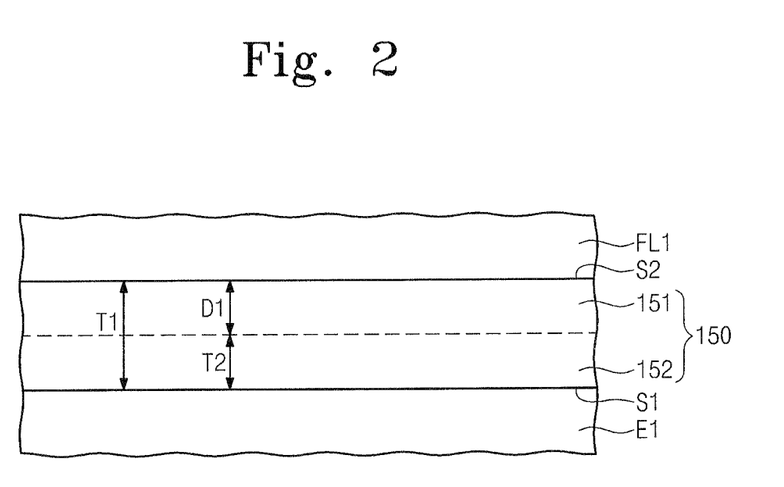
FIG. 2 is an enlarged view illustrating part of the electrowetting display shown in FIG. 1.

FIG. 2 is an enlarged view illustrating part of the electrowetting display shown in FIG. 1. FIG. 2 shows an interface between the hydrophobic barrier layer 150 and the first fluid FL1 and an interface between the hydrophobic barrier layer 150 and the first electrode E1.

Referring to FIG. 2, the hydrophobic barrier layer 150 includes a first surface S1 and a second surface S2 facing the first surface S1. The first surface S1 contacts the first electrode E1, and the second surface S2 contacts the first fluid FL1. Since the hydrophobic barrier layer 150 is divided into the hydrophobic portion 151 and the hydrophilic portion 152, the hydrophobic portion 151 contacts the first fluid FL1 through the second surface S2, and the hydrophilic portion 152 contacts the first electrode E1 through the first surface S1.

According to an embodiment, the hydrophilic portion 152 includes an inorganic insulating material, and the hydrophobic portion 151 includes a fluorine-containing inorganic insulating material. For instance, the hydrophilic portion 152 includes at least one of silicon oxide (SiOx) or silicon nitride (SiNx), and the hydrophobic portion 151 includes at least one of fluorinated silicon oxide (SiOF) or fluorinated silicon nitride (SiNF). According to an embodiment, the hydrophobic portion 151 is obtained by performing a chemical reaction on the hydrophilic portion 152 or includes a fluorine-containing inorganic insulating material, which is obtained by a chemical reaction on a fluorine-containing material included in the hydrophilic portion 152.

The hydrophobic portion 151 has a thickness equal to or substantially equal to a first depth D1, and the hydrophilic portion 152 has a second thickness T2 equal to or substantially equal to a difference between the first depth D1 and a first thickness T1 of the hydrophobic barrier layer 150.

Due to the fluorine contained in the hydrophobic portion 151, the second surface S2 has a hydrophobicity stronger than a hydrophobicity of the first surface S1. A contact angle of water with respect to the first surface S1 is about 100° or less, and a contact angle of water with respect to the second surface S2 is about 100° or more, for example, about 120° or more. Therefore, when the first fluid FL1 and the second fluid FL2 include the above-mentioned materials, respectively, the first fluid FL1 has wettability higher than of the second fluid FL2 with respect to the second surface S2. As a consequence, when no electric field is formed between the first electrode E1 and the second electrode E2, the first fluid FL1 may be disposed more close to the second surface S2 than the second fluid FL2 in the electrowetting layer FL.

Since the first surface S1 has hydrophilicity stronger than the second surface S2, the hydrophilic portion 152 has the adhesive force stronger than the hydrophobic portion 151 with respect to the first electrode E1. Thus, the hydrophilic portion 152 may stably cover the first electrode E1.

A conventional electrowetting display includes a hydrophobic layer having superior wettability with respect to the first fluid FL1 and a hydrophilic barrier layer having superior adhesive property (e.g., adhesivity) with respect to the first electrode E1, or includes a separate adhesive layer disposed between the hydrophobic layer and the barrier layer to improve the adhesive property between the hydrophobic layer and the barrier layer. However, according to an exemplary embodiment of the present invention, the hydrophobic barrier layer 150 includes the first and second surfaces S1 and S2, which have different layer characteristics. The hydrophobic layer and the barrier layer are replaced with the first and second surfaces S1 and S2. Although the hydrophobic barrier layer 150 is divided into the hydrophobic portion 151 and the hydrophilic portion 152, the adhesive property of the hydrophobic portion 151 and the hydrophilic portion 152 may be prevented from being degraded since the hydrophobic barrier layer 150 is an integrally formed single layer.

Figure 3:
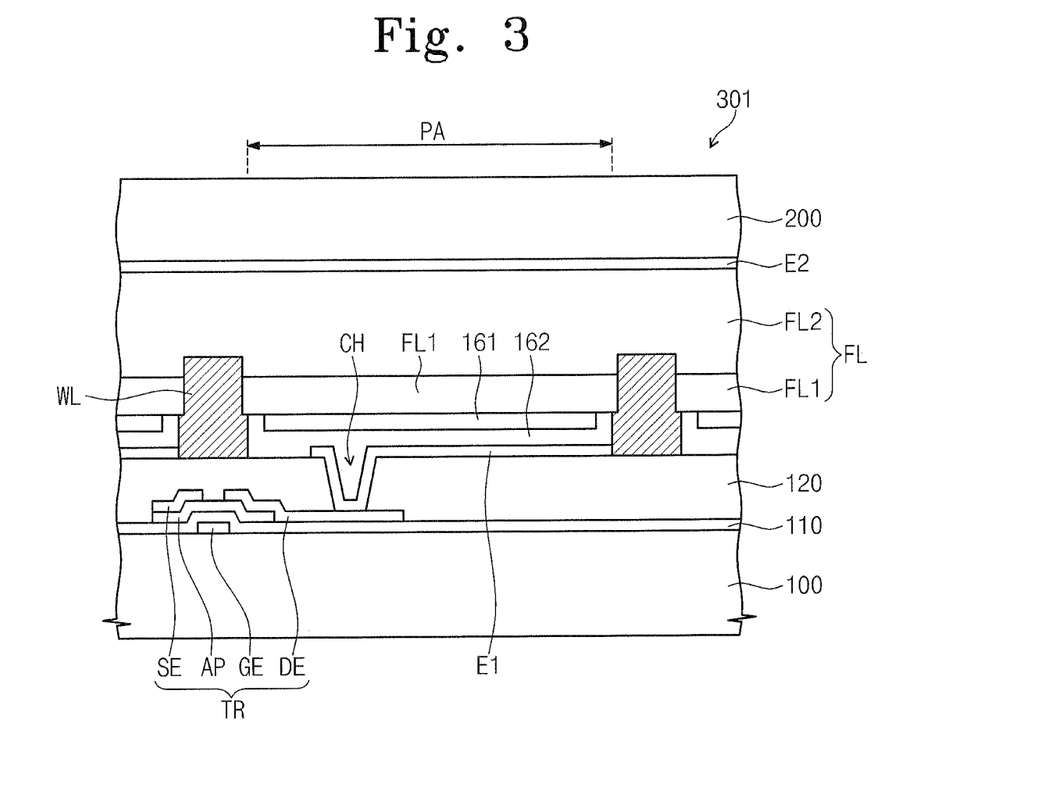
FIG. 3 is a cross-sectional view showing an electrowetting display according to another exemplary embodiment of the present invention.

FIG. 3 is a cross-sectional view showing an electrowetting display according to an exemplary embodiment of the present invention.

Referring to FIG. 3, a barrier layer 162 and a hydrophobic layer 161 are sequentially disposed on a first substrate 100 on which a thin film transistor TR, a first electrode E1, and a plurality of partition walls WL are disposed. The barrier layer 162 is disposed on the first electrode E1 and covers the first electrode E1. The hydrophobic layer 161 is disposed on the barrier layer 162 between the barrier layer 162 and the electrowetting layer FL.

In an exemplary embodiment, the partition walls WL are disposed on the organic layer 120 to correspond to the peripheries of the pixel areas PA, and thus the partition walls WL do not overlap the barrier layer 162 and the hydrophobic layer 161 when viewed in a plan view. Accordingly, the barrier layer 162 and the hydrophobic layer 161 are disposed corresponding to the pixel areas PA between two partition walls WL adjacent to each other among the partition walls WL.

The barrier layer 162 includes an inorganic insulating material, and the hydrophobic layer 161 includes a fluorine-containing inorganic insulating material. For instance, the barrier layer 162 includes at least one of silicon oxide (SiOx) or silicon nitride (SiNx), and the hydrophobic layer 161 includes at least one of fluorinated silicon nitride (SiNF) or fluorinated silicon oxide (SiOF). According to an embodiment, the hydrophobic layer 161 has a hydrophobicity stronger than a hydrophobicity of the barrier layer 162.

Figure 4:
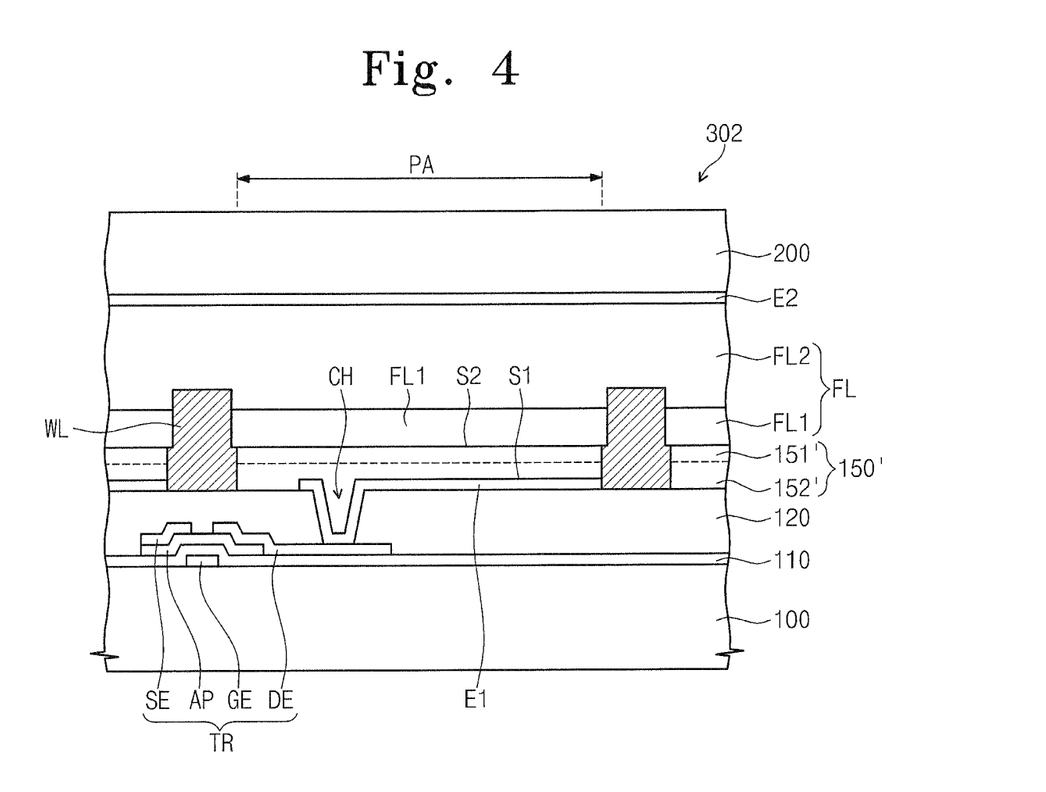
FIG. 4 is a cross-sectional view showing an electrowetting display according to another exemplary embodiment of the present invention.

FIG. 4 is a cross-sectional view showing an electrowetting display according to an exemplary embodiment of the present invention.

Referring to FIG. 4, a hydrophobic barrier layer 150' is disposed on the first substrate 100 on which the thin film transistor TR, the first electrode E1, and the partition walls WL are disposed. The hydrophobic barrier layer 150' includes a hydrophobic portion 151' having a second surface S2 and a hydrophilic portion 152' having a first surface S1. The second surface S2 has a hydrophobicity stronger than a hydrophobicity of the first surface S1, and thus the hydrophobic portion 151' contacts the first fluid FL1 of the electrowetting layer FL, and the hydrophilic portion 152' contacts the first electrode E1. Thus, as described with reference to FIGS. 1 and 2, the hydrophobic barrier layer 150' may increase wettability with respect to the first fluid FL1 and adhesive properties, e.g., adhesivity, with respect to the first electrode E1.

In an exemplary embodiment, the partition walls WL are disposed on the organic insulating layer 120 to correspond to the peripheries of the pixel areas PA and do not overlap the hydrophobic barrier layer 150' when viewed in a plan view. Accordingly, the hydrophobic barrier layer 150' is disposed in the pixel areas PA each of which is disposed between two partition walls adjacent to each other among the partition walls WL.

The hydrophobic portion 151' includes an inorganic insulating material, and the hydrophilic portion 152' includes a fluorine-containing inorganic insulating material. For instance, the hydrophilic portion 152' includes at least one of silicon oxide (SiOx) or silicon nitride (SiNx), and the hydrophobic portion 151' includes at least one of fluorinated silicon nitride (SiNF) or fluorinated silicon oxide (SiOF). According to an embodiment, the hydrophobic portion 151' has a hydrophobicity stronger than a hydrophobicity of the hydrophilic portion 152' in the hydrophobic barrier layer 150'.

Figure 5A:
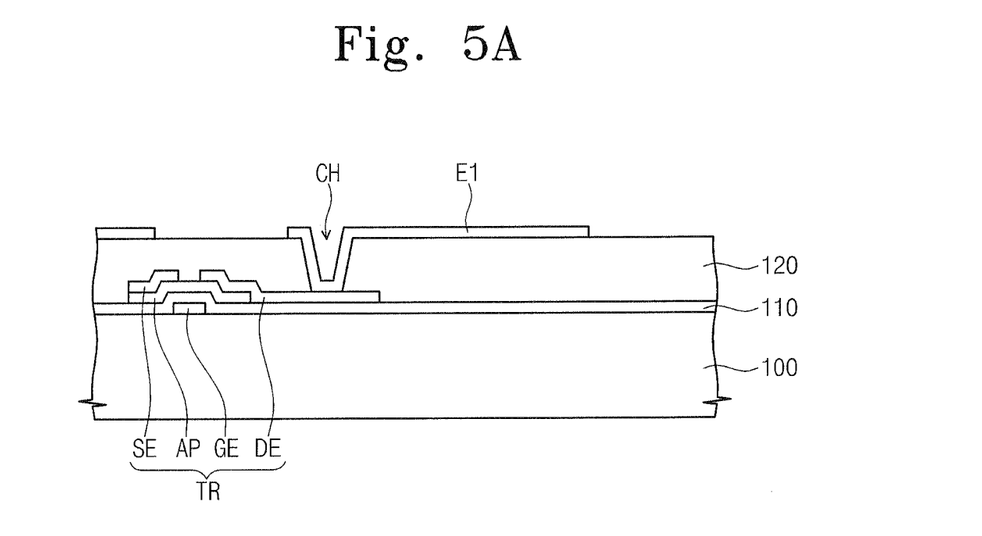
FIGS. 5A to 5C are cross-sectional views explaining a method of manufacturing the electrowetting display shown in FIG. 1.
Figure 5B:
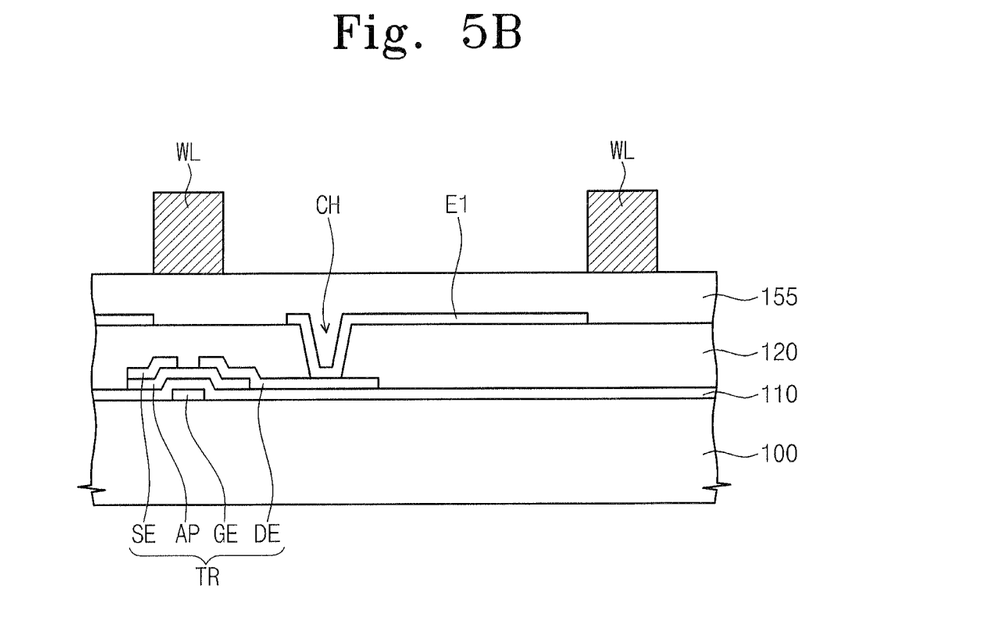
Figure 5C:
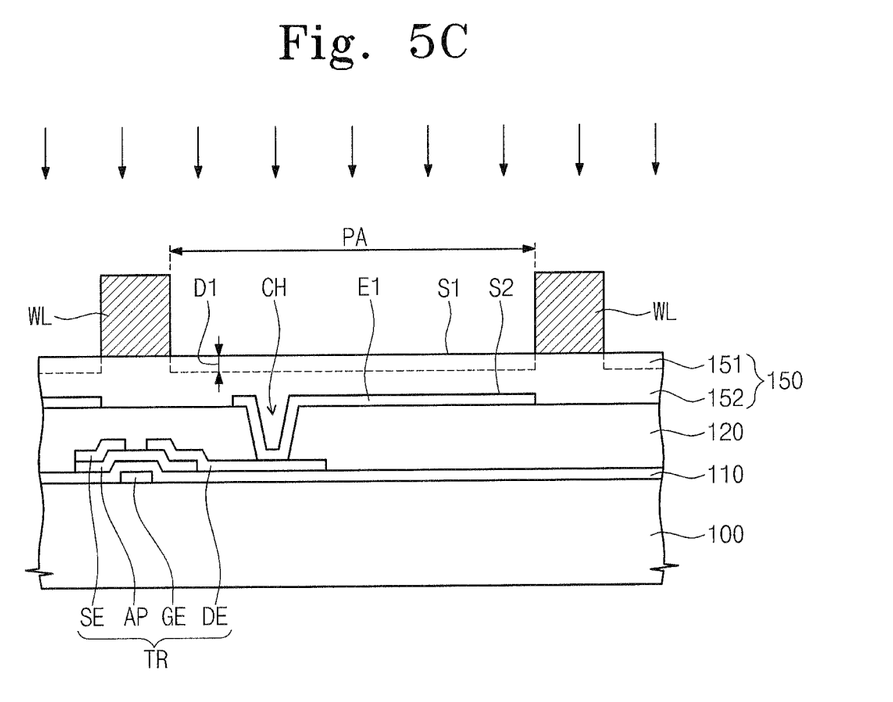

FIGS. 5A to 5C are cross-sectional views for describing a method of manufacturing the electrowetting display shown in FIG. 1.

Referring to FIG. 5A, the thin film transistor TR is formed on the first substrate 100, and the organic insulating layer 120 is formed on the first substrate 100 and covers the thin film transistor TR. Then, the contact hole CH is formed through the organic insulating layer 120 and exposes the drain electrode DE of the thin film transistor TR. The first electrode E1 is formed on the organic insulating layer 120 and is electrically connected to the drain electrode DE through the contact hole CH.

Referring to FIG. 5B, a preliminary barrier layer 155 is formed on the first substrate 100 and covers the first electrode E1. According to an embodiment, the preliminary barrier layer 155 is formed using a chemical vapor deposition (CVD) method. When the chemical vapor deposition method is used, the preliminary barrier layer 155 is formed by loading the first substrate 100, on which the first electrode E1 is formed, into a chamber and injecting a reaction gas containing silicon gas, e.g., $SiH_4$, or $SiF_4$, and a reaction gas containing nitrogen or oxygen, e.g., $O_2$, $NH_3$, $N_2$, or $N_2O$, into the chamber. As a result, the preliminary barrier layer 155 includes at least one of silicon oxide (SiOx) or silicon nitride (SiNx).

A temperature in the chamber is maintained in a range from about 150 degrees Celsius to about 350 degrees Celsius while performing the chemical vapor deposition (CVD) method. When the temperature in the chamber is lower than about 150 degrees Celsius, the quality of the preliminary barrier layer 155 may be degraded—for example, the density of the preliminary barrier layer 155 may be decreased. When the temperature in the chamber exceeds about 350 degrees Celsius, the first substrate 100 may be deformed by heat in the chamber.

After the preliminary barrier layer 155 is formed, the partition walls WL are formed on the preliminary barrier layer 155. The partition walls WL are formed by forming a photoresist layer on the preliminary barrier layer 155 and performing an exposure and development process on the photoresist layer.

Referring to FIGS. 5B and 5C, the exposed surface of the preliminary barrier layer 155 is surface-treated using the partition masks WL as a mask to form the hydrophobic barrier layer 150. In an exemplary embodiment, the surface treatment for the exposed surface of the preliminary barrier layer 155 may be performed by a plasma surface treatment. According to an embodiment, a source gas containing fluorine, e.g., $SiF_4$, $NF_3$, $CF_4$, or $SF_6$, is provided into the chamber, and a chemical reaction occurs on the surface of the preliminary barrier layer 155. The chemical reaction progresses to the first depth D1 from the first surface S1 of the preliminary barrier layer 155, so that the hydrophobic portion 151 which has undergone the chemical reaction and the hydrophilic portion 152 which has not undergone the chemical reaction may be defined in the hydrophobic barrier layer 150.

By the chemical reaction that occurs during the plasma surface treatment, the hydrophobic portion 151 contains fluorine so that the hydrophobic portion 151 has a hydrophobicity stronger than a hydrophobicity of the hydrophilic portion 152. The partition walls WL are exposed to the source gas when the preliminary barrier layer 155 undergoes the plasma surface treatment. However, an adhesive force between the preliminary barrier layer 155 formed of the inorganic material and fluorine atoms is stronger than an adhesive force between the partition walls WL formed of the organic material and the fluorine atoms. Thus, the hydrophobic portion 151 may have a hydrophobicity stronger than a hydrophobicity of the partition walls WL.

Then, an electrowetting layer, such as the electrowetting layer FL of FIG. 1, is formed on the hydrophobic barrier layer 150. Since the hydrophobic portion 151 has hydrophobicity by the plasma surface treatment, the hydrophobic portion 151 has superior wettability with respect to the first fluid FL1 (refer to FIG. 1). The first fluid FL1 may be prevented from moving between pixel areas adjacent to each other along the surface of the partition walls WL since the hydrophobic portion 151 has a hydrophobicity stronger than a hydrophobicity of the partition walls WL.

When the process of forming the preliminary barrier layer 155 is referred to as a first process and the plasma surface treatment is referred to as a second process, the first and second processes may be successively performed in one chamber by properly controlling the types of source gas injected into the chamber during the first and second processes. Accordingly, a time required to perform the first and second processes may be reduced.

When a plasma enhanced chemical vapor deposition method, which is performed under a vacuum in the chamber similarly to the second process, is applied to the first process, the vacuum state of the chamber does not need to be usually adjusted or varied when the second process begins after the first process is finished. Therefore, the time required to perform the first and second processes may be reduced, and gathering of foreign substances on the first substrate 100, which is caused by a variation in the vacuum state of the chamber between the first and second processes, may be prevented.

Then, the second electrode E2 (refer to FIG. 1) is formed on the second substrate 200 (refer to FIG. 1), and the first substrate 100 on which the electrowetting layer FL (refer to FIG. 1) is formed is coupled to the second substrate 200. As a result, as shown in FIG. 1, the electrowetting display 300 in which the electrowetting layer FL is disposed between the first substrate 100 and the second substrate 200 is manufactured.

FIGS. 6A to 6D are cross-sectional views for describing a method of manufacturing the electrowetting display shown in FIG. 3.

Figure 6A:
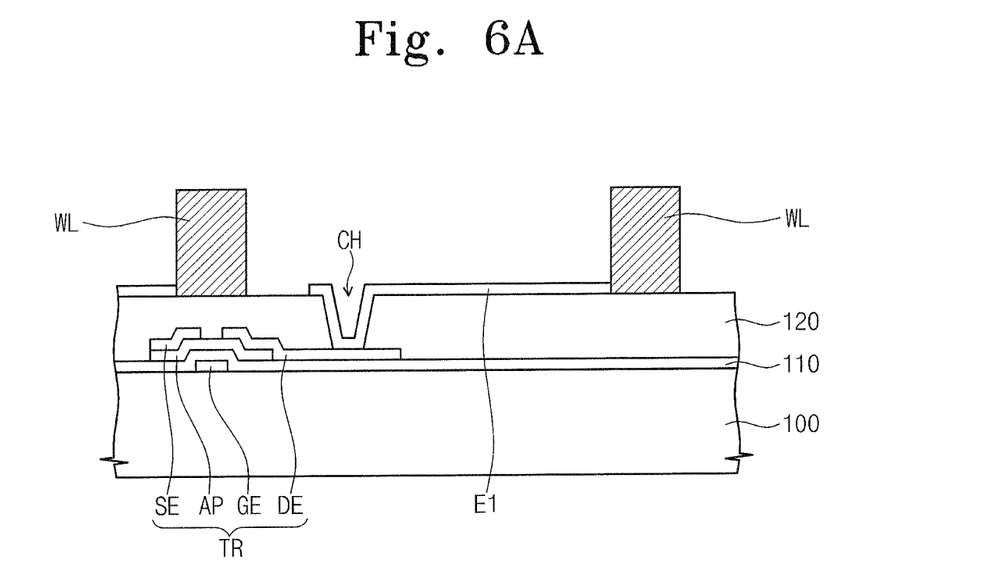
FIGS. 6A to 6D are cross-sectional views explaining a method of manufacturing the electrowetting display shown in FIG. 3.

Referring to FIG. 6A, the thin film transistor TR is formed on the first substrate 100, and the organic insulating layer 120 is formed on the first substrate 100 and covers the thin film transistor TR. Then, the contact hole CH is formed through the organic insulating layer 120 and exposes the drain electrode DE of the thin film transistor TR. The first electrode E1 is formed on the organic insulating layer 120 and is electrically connected to the drain electrode DE through the contact hole CH.

Then, the partition walls WL are formed on the organic layer 120. The partition walls WL are formed by forming a photoresist layer on the organic layer 120 and performing an exposure and development process on the photoresist layer.

Figure 6B:
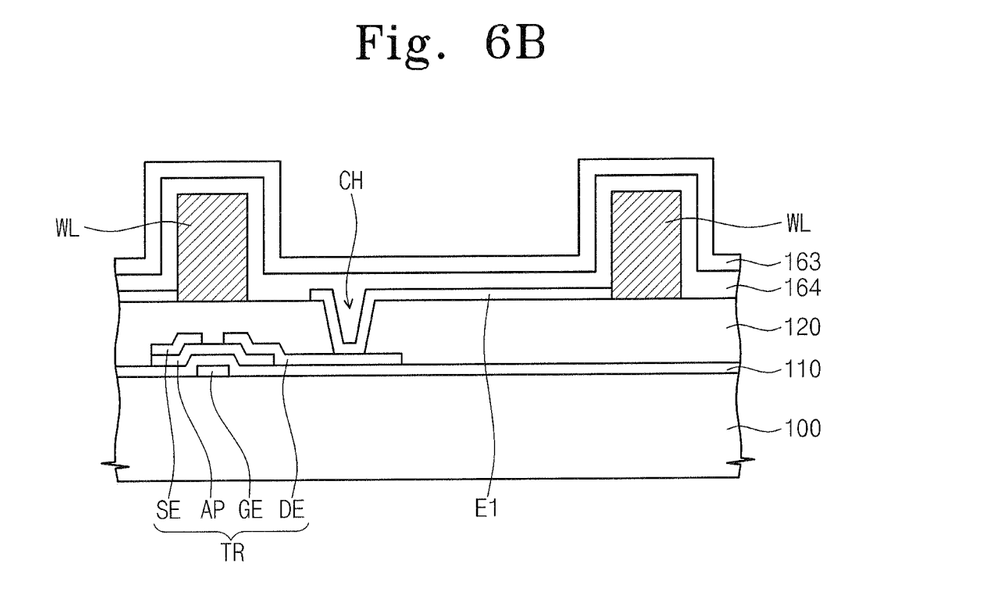

Referring to FIG. 6B, a preliminary barrier layer 164 and a preliminary hydrophobic layer 163 are sequentially formed over an entire surface of the first substrate 100. Accordingly, the preliminary barrier layer 164 and the preliminary hydrophobic layer 163 cover upper and side surfaces of each of the partition walls WL.

In an exemplary embodiment, the preliminary barrier layer 164 is formed by the same or substantially the same chemical vapor deposition method as used to form the preliminary barrier layer 155 described with reference to FIG. 5B. Thus, the preliminary barrier layer 164 is formed of a material that includes at least one of silicon oxide (SiOx) or silicon nitride (SiNx). The preliminary hydrophobic layer 163 is formed using a chemical vapor deposition method that uses a source gas containing fluorine, e.g., $SiF_4$, $NF_3$, or $CF_4$, and a reaction gas containing $NH_3$ or $N_2O$. Accordingly, the preliminary hydrophobic layer 163 is formed of a material that includes at least one of fluorinated silicon oxide (SiOF) or fluorinated silicon nitride (SiNF).

Figure 6C:
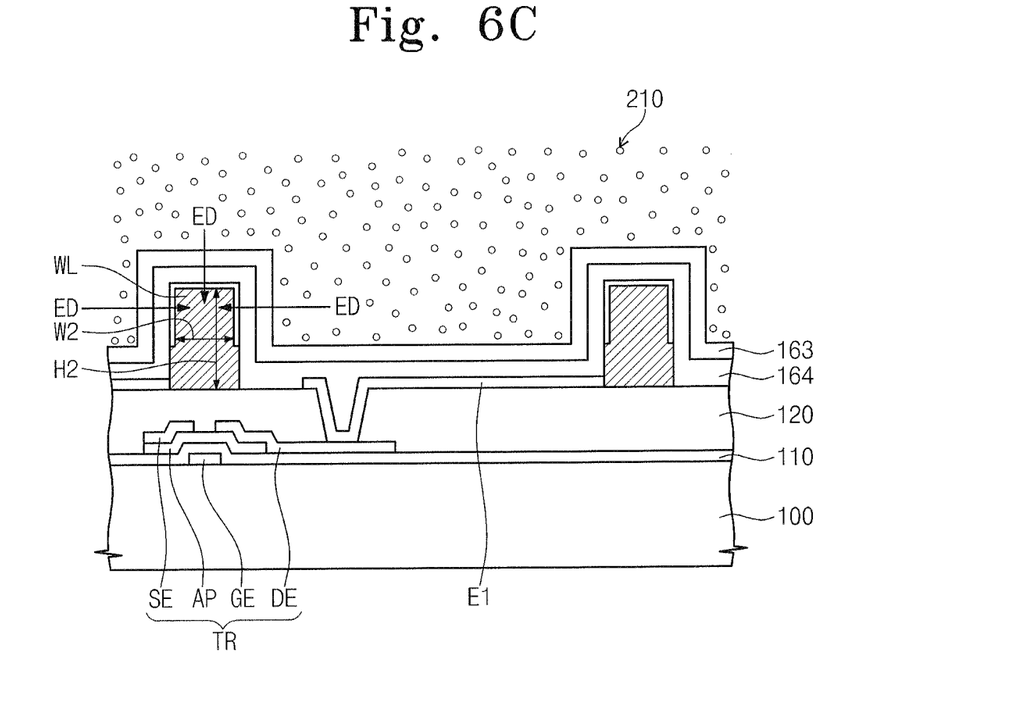

Referring to FIGS. 6B and 6C, an etchant 210 is provided on the first substrate on which the preliminary hydrophobic layer 163 and the preliminary barrier layer 164 are formed. The etchant 210 includes a material that etches the partition walls WL and does not etch parts other than the partition walls WL. In an exemplary embodiment, the etchant 210 includes potassium hydroxide (KOH), tetramethylammoniumhydroxide (TMAH), and N-methylpyrollidinone (NMP) when the partition walls WL are formed of a negative photoresist material, e.g., SU-8, which is a product name. According to an embodiment, the partition walls WL are etched by a plasma ashing process. According to an embodiment, a plasma source used in the plasma ashing process includes $CF_4$ and $O_2$, or $SF_6$ and $O_2$.

Through the above-mentioned etching process, upper portions and side portions of the partition walls WL are etched. According to an embodiment, the upper portions and the side portions of the partition walls WL are selectively etched along an etching direction, thereby reducing a height H2 and a width W2 of the partition walls WL.

The reason why the portions of the partition walls WL are etched by the etchant 210 although the partition walls WL are covered by the preliminary barrier layer 164 and the preliminary hydrophobic layer 163 is as follows. In general, when a thin layer is deposited on a deposition surface using a chemical vapor deposition method, a density of the thin layer depends on whether the deposition surface has hydrophobicity or hydrophilicity. When the preliminary barrier layer 164 and the preliminary hydrophobic layer 163 are deposited on the partition walls WL and the first electrode E1, the preliminary barrier layer 164 and the preliminary hydrophobic layer 163 deposited on the first electrode E1 have a density greater than a density of the preliminary barrier layer 164 and the preliminary hydrophobic layer 163 deposited on the partition walls WL since a surface of the partition walls WL formed of the photoresist has a hydrophobicity stronger than a hydrophobicity of the first electrode E1 formed of an oxide material. This will be described in detail with reference to FIGS. 7A and 7B.

Figure 7A:
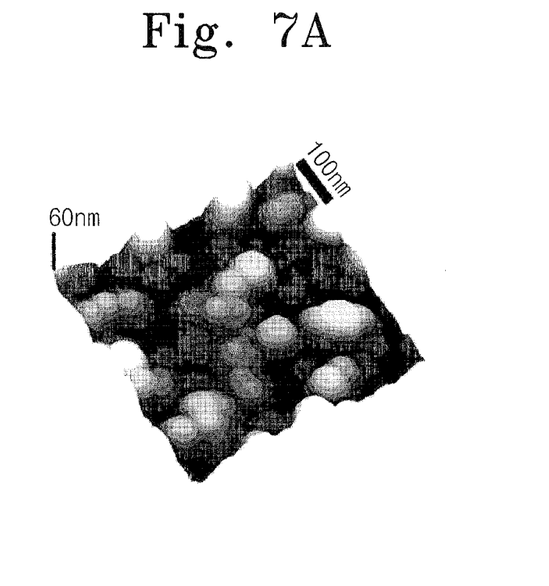
FIG. 7A is a SEM image showing a preliminary barrier layer and a preliminary hydrophobic layer, which are deposited on partition walls shown in FIG. 6B.
Figure 7B:
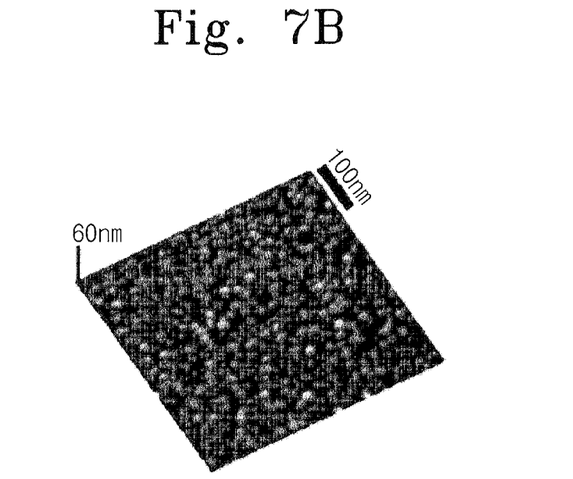
FIG. 7B is a SEM image showing a preliminary barrier layer and a preliminary hydrophobic layer, which are deposited on a first electrode shown FIG. 6B.

FIG. 7A is an SEM image showing the preliminary barrier layer 164 and the preliminary hydrophobic layer 163, which are deposited on the partition walls WL shown in FIG. 6B, and FIG. 7B is an SEM image showing the preliminary barrier layer 164 and the preliminary hydrophobic layer 163, which are deposited on the first electrode E1 shown FIG. 6B.

Referring to FIGS. 6B, 7A, and 7B, since surfaces of the partition walls WL has a hydrophobicity stronger than a hydrophobicity of a surface of the first electrode E1, particles included in the preliminary barrier layer 164 and the preliminary hydrophobic layer 163 tend to gather more on the surfaces of the partition walls WL rather than on the surface of the first electrode E1. Accordingly, the preliminary barrier layer 164 and the preliminary hydrophobic layer 163 become denser on the partition walls WL than on the first electrode E1.

As shown in FIG. 7A, when the density of the preliminary barrier layer 164 and the preliminary hydrophobic layer 163 decreases, pin holes are formed between the particles, and foreign substances may infiltrate into the pin holes. The etchant 210 may infiltrate into the partition walls WL through the pin holes during the etching process described with reference to FIG. 6C, so that portions of the partition walls WL may be etched by the etchant 210.

Figure 6D:
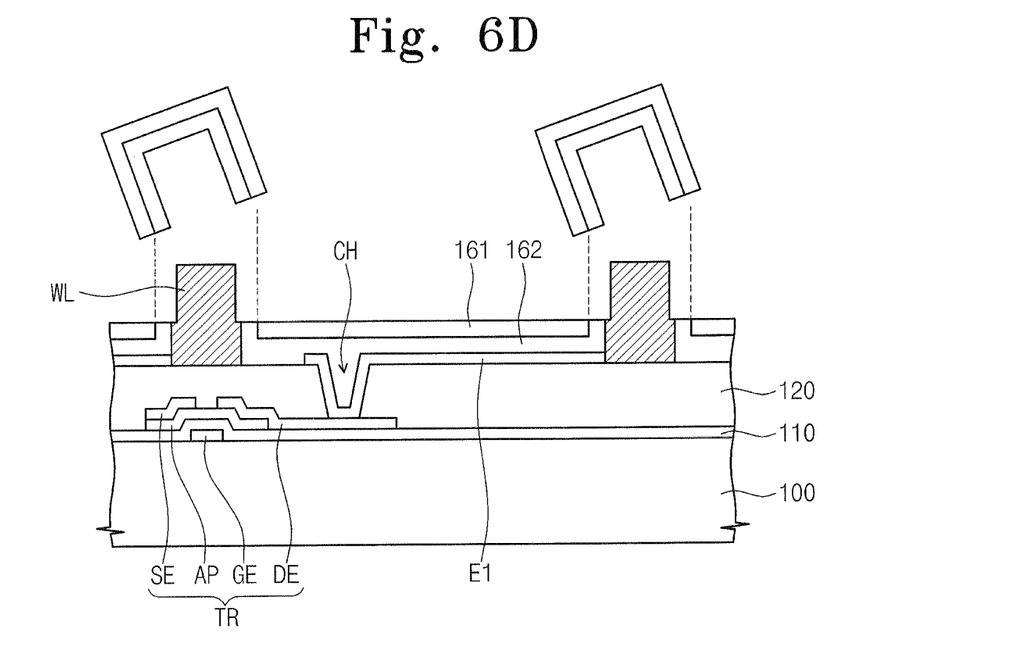

Referring to FIGS. 6C and 6D, to prevent an adhesive force from decreasing between the partition walls WL and the preliminary hydrophobic layer 163 and the preliminary barrier layer 164 after portions of the partition walls WL are etched, portions of the preliminary hydrophobic layer 163 and the preliminary barrier layer 164, which are formed on the partition walls WL, may be removed by a lift-off process. The preliminary hydrophobic layer 163 and the preliminary barrier layer 164 are patterned by the lift-off process, thereby forming the hydrophobic layer 161 and the barrier layer 162. The preliminary barrier layer 164 and the preliminary hydrophobic layer 163 may be patterned using the lift-off process without performing a photolithography process with a separate mask, to thereby easily form the barrier layer 162 and the hydrophobic layer 161.

Figure 8A:
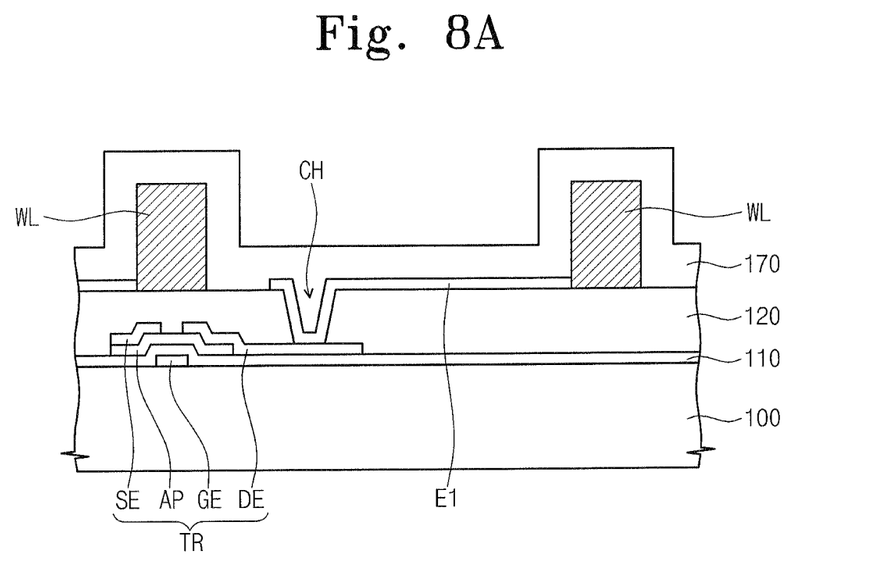
FIGS. 8A to 8C are cross-sectional views explaining a method of manufacturing the electrowetting display shown in FIG. 4.
Figure 8B:
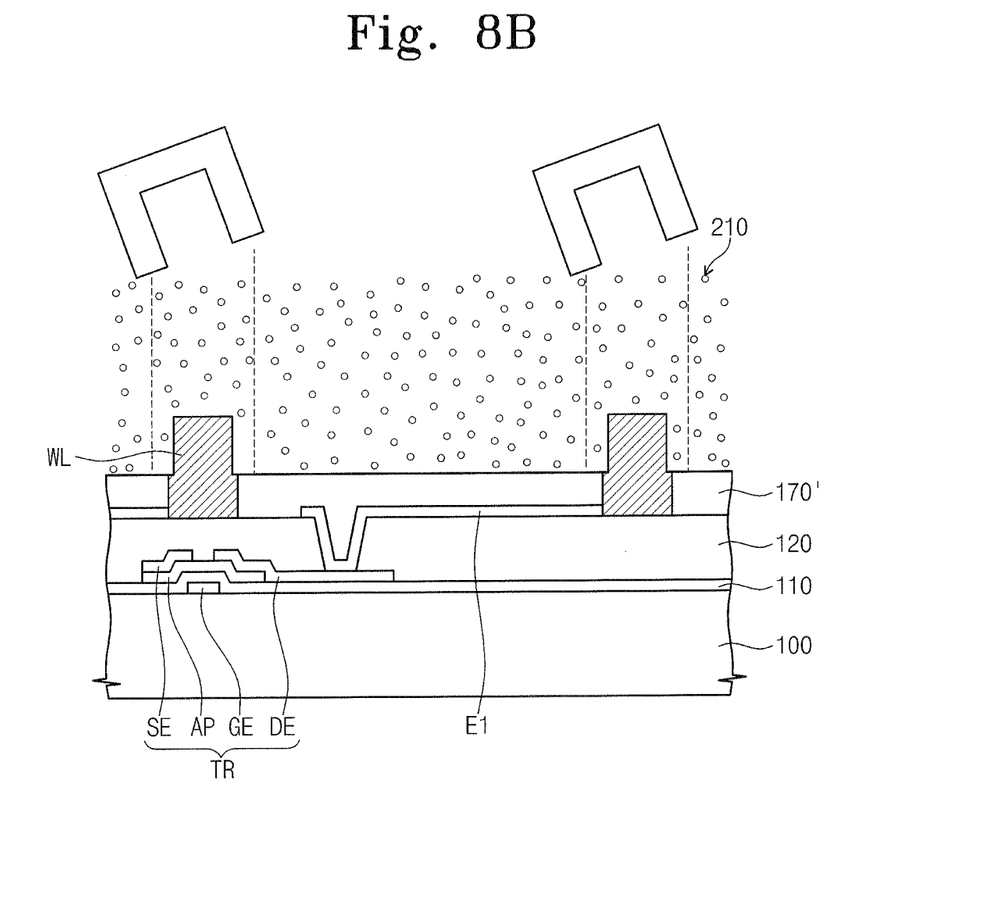
Figure 8C:
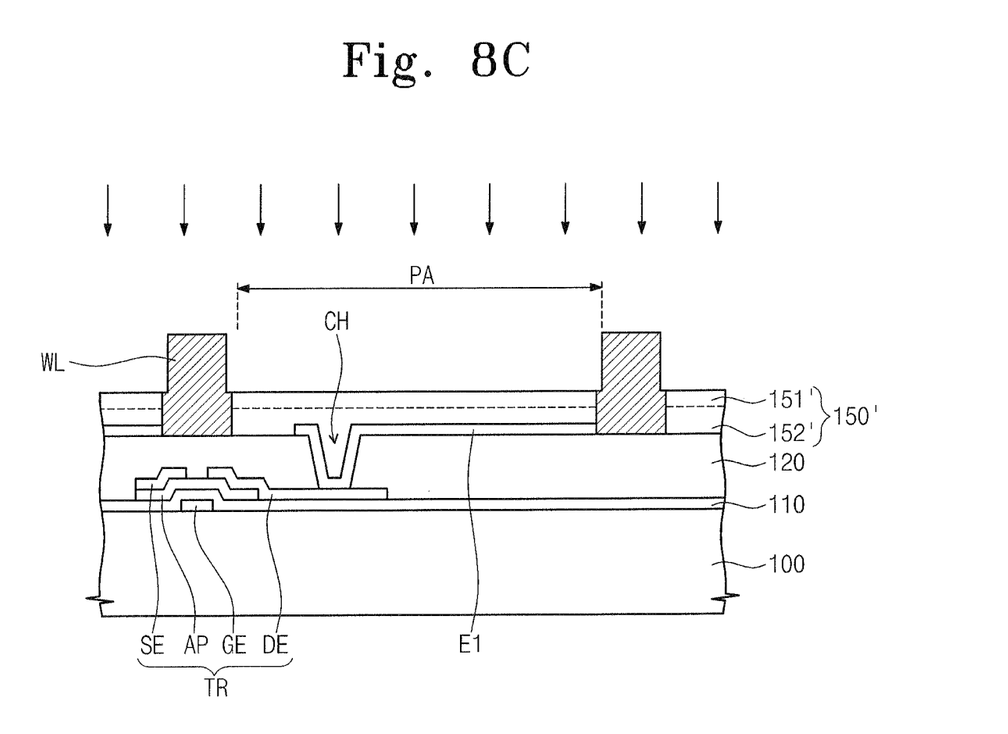

FIGS. 8A to 8C are cross-sectional views for describing a method of manufacturing the electrowetting display shown in FIG. 4.

Referring to FIG. 8A, a thin film transistor TR, an organic insulating layer 120, and a first electrode E1 are formed on a first substrate 100, and a plurality of partition walls WL are formed on the organic insulating layer 120. Then, a first preliminary barrier layer 170 is formed on the first substrate 100 and covers the partition walls WL.

Referring to FIGS. 8B and 8C, when the etching process described with reference to FIG. 6C is applied to the first substrate 100, a portion of the first preliminary barrier layer 170, which is formed on upper and side portions of the partition walls WL, is removed by using a lift-off process. Accordingly, the first preliminary barrier layer 170 is patterned, and a second preliminary barrier layer 170' remains in the pixel areas PA.

Then, the plasma surface treatment described with reference to FIG. 5C is performed on the second preliminary barrier layer 170' to form a hydrophobic barrier layer 150' including a hydrophobic portion 151' and a hydrophilic portion 152'.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. An electrowetting display comprising:
a first substrate;
a second substrate facing the first substrate;
an electrowetting layer between the first substrate and the second substrate, the electrowetting layer including a first fluid and a second fluid, wherein the first fluid has electrical conductivity or a polarity;
a first electrode on the first substrate;
a second electrode configured to form an electric field in cooperation with the first electrode; and
a hydrophobic barrier layer between the first substrate and the electrowetting layer to cover the first electrode, wherein the hydrophobic barrier layer includes a first surface contacting the first electrode and a second surface having a hydrophobicity stronger than a hydrophobicity of the first surface, and wherein the second surface contacts the electrowetting layer.

2. The electrowetting display of claim 1, wherein the hydrophobic barrier layer comprises:
a hydrophilic portion that includes the first surface and contacts the first electrode; and
a hydrophobic portion coupled to the hydrophilic portion, wherein the hydrophobic portion includes the second surface and contacts the electrowetting layer.

3. The electrowetting display of claim 2, wherein the first surface faces the second surface, and wherein the hydrophobic portion has a thickness equal to or substantially equal to a predetermined depth from the second surface, and the hydrophilic portion has a thickness equal to or substantially equal to a difference between the thickness of the hydrophobic portion and a thickness of the hydrophobic barrier layer.

4. The electrowetting display of claim 2, wherein the hydrophobic portion comprises an inorganic insulating material containing fluorine.

5. The electrowetting display of claim 4, wherein the hydrophilic portion comprises at least one of silicon oxide or silicon nitride, and the hydrophobic portion comprises at least one of fluorinated silicon oxide or fluorinated silicon nitride.

6. The electrowetting display of claim 2, further comprising a plurality of partition walls on the hydrophobic barrier layer, wherein the plurality of partition walls correspond to a periphery of a pixel area of the first substrate, and wherein the hydrophilic portion is disposed in an area of the hydrophobic barrier layer, which overlaps the partition walls when viewed in a plan view.

7. The electrowetting display of claim 6, wherein the hydrophobic portion and the hydrophilic portion are disposed in an area of the hydrophobic barrier layer, which corresponds to the pixel area.

8. The electrowetting display of claim 2, further comprising a plurality of partition walls on a periphery area of a pixel area of the first substrate, wherein the hydrophobic barrier layer is disposed in the pixel area between two partition walls adjacent to each other among the partition walls.

9. The electrowetting display of claim 8, wherein the hydrophobic barrier layer is substantially spaced apart from the partition walls when viewed in a plan view.

10. The electrowetting display of claim 1, wherein the hydrophobic barrier layer comprises:
a hydrophilic layer that includes the first surface and contacts the first electrode; and
a hydrophobic layer on the hydrophilic layer, the hydrophobic layer including the second surface, wherein the hydrophobic layer contacts the electrowetting layer, and wherein the hydrophobic layer comprises at least one of fluorinated silicon oxide or fluorinated silicon nitride.

11. An electrowetting display comprising:
a first substrate and a second substrate facing the first substrate;

an electrowetting layer between the first substrate and the second substrate, the electrowetting layer including a first fluid and a second fluid;

a first electrode on the first substrate;

a second electrode on the second substrate and configured to form an electric field in cooperation with the first electrode; and a barrier layer covering the first electrode, wherein the barrier layer includes a first portion and a second portion, the first portion contacts the first electrode and has a first hydrophobicity, the second portion contacts the electrowetting layer and has a second hydrophobicity, and the second hydrophobicity is greater than the first hydrophobicity.

12. The electrowetting display of claim 11, wherein the second portion of the barrier layer comprises an inorganic insulating material containing fluorine.

13. The electrowetting display of claim 11, wherein the first portion of the barrier layer comprises at least one of silicon oxide or silicon nitride, and the second portion of the barrier layer comprises at least one of fluorinated silicon oxide or fluorinated silicon nitride.

14. The electrowetting display of claim 11, further comprising a plurality of partition walls on the barrier layer, wherein the plurality of partition walls correspond to a periphery of a pixel area of the first substrate, and wherein the first portion of the barrier layer is disposed in an area of the barrier layer that overlaps the partition walls when viewed in a plan view.

15. The electrowetting display of claim 14, wherein the first portion and the second portion of the barrier layer are disposed in an area of the barrier layer that corresponds to the pixel area.

16. The electrowetting display of claim 11, further comprising a plurality of partition walls on a periphery area of a pixel area of the first substrate, wherein the barrier layer is disposed in the pixel area between two partition walls adjacent to each other among the partition walls.

17. The electrowetting display of claim 16, wherein the barrier layer is substantially spaced apart from the partition walls when viewed in a plan view.

* * * * *